(12) United States Patent
Doi

(10) Patent No.: US 9,029,186 B2
(45) Date of Patent: May 12, 2015

(54) METHOD OF FORMING ELECTRODES FOR A SOLAR BATTERY

(75) Inventor: Makoto Doi, Tokyo (JP)

(73) Assignee: Mitsubishi Electric Coporation, Chiyoda-Ku, Tokyo (JP)

(*) Notice: Subject to any disclaimer, the term of this patent is extended or adjusted under 35 U.S.C. 154(b) by 570 days.

(21) Appl. No.: 13/386,986

(22) PCT Filed: Aug. 6, 2009

(86) PCT No.: PCT/JP2009/063941
§ 371 (c)(1),
(2), (4) Date: Jan. 25, 2012

(87) PCT Pub. No.: WO2011/016122
PCT Pub. Date: Feb. 10, 2011

(65) Prior Publication Data
US 2012/0125434 A1 May 24, 2012

(51) Int. Cl.
*H01L 21/00* (2006.01)
*H01L 31/00* (2006.01)
(Continued)

(52) U.S. Cl.
CPC ... *H01L 31/022425* (2013.01); *H01L 31/02168* (2013.01); *H01L 31/022433* (2013.01); *H01L 51/441* (2013.01); *H01L 31/0512* (2013.01);
(Continued)

(58) Field of Classification Search
CPC .................. Y02E 10/547; H01L 31/022425; H01L 31/0512; H01L 31/02366; H01L 31/022433; H01L 31/068; H01L 51/441; H01L 31/1884; H01L 31/02168
See application file for complete search history.

(56) References Cited

U.S. PATENT DOCUMENTS 6,379,995 B1 4/2002 Kawama et al.
7,744,714 B2 * 6/2010 Akimoto ................. 156/236
(Continued)

FOREIGN PATENT DOCUMENTS

EP   0 836 892 A2   4/1998
JP   2000-101114 A   4/2000
(Continued)

OTHER PUBLICATIONS

The Extended European Search Report issued on Dec. 5, 2013, by the European Patent Office in corresponding European Patent Application No. 09848054.4-1508. (6 pages).
(Continued)

*Primary Examiner* — Alonzo Chambliss
(74) *Attorney, Agent, or Firm* — Buchanan Ingersoll & Rooney PC

(57) ABSTRACT

A method for forming an electrode of a solar battery on an electrode forming face of a semiconductor substrate, comprises: applying a resin containing a conductor material to be the electrode onto an electrode forming region of the electrode forming face; causing a pattern transfer member, on which a reverse pattern obtained by reversing a pattern of the electrode is formed, to face the electrode forming face, and registering the pattern transfer member on a position in which the electrode is to be formed in the electrode forming face; pressing the pattern transfer member against the electrode forming face to transfer the electrode pattern to the resin containing the conductor material; separating the pattern transfer member from the resin containing the conductor material; and baking the electrode pattern transferred to the resin containing the conductor material to form the electrode on the electrode forming face of the substrate.

10 Claims, 10 Drawing Sheets

(51) Int. Cl.
*H01L 31/0224* (2006.01)
*H01L 31/05* (2014.01)
*H01L 31/18* (2006.01)
*H01L 31/068* (2012.01)
H01L 31/0216 (2014.01)
H01L 51/44 (2006.01)

(52) U.S. Cl.
CPC .......... *H01L 31/1884* (2013.01); *H01L 31/068* (2013.01); *Y02E 10/547* (2013.01)

(56) References Cited

U.S. PATENT DOCUMENTS

| | | | | |
|---|---|---|---|---|
| 7,883,343 | B1 * | 2/2011 | Mulligan et al. | 439/98 |
| 8,399,287 | B1 * | 3/2013 | Mulligan et al. | 438/98 |
| 2002/0130605 | A1 | 9/2002 | Mueller et al. | |
| 2007/0132157 | A1 | 6/2007 | Tokita et al. | |
| 2008/0116615 | A1 * | 5/2008 | Akimoto | 264/400 |
| 2011/0056552 | A1 * | 3/2011 | Fujishima | 136/256 |
| 2012/0118371 | A1 * | 5/2012 | Yoshida et al. | 136/256 |
| 2014/0007937 | A1 * | 1/2014 | Maeda | 136/256 |

FOREIGN PATENT DOCUMENTS

| | | |
|---|---|---|
| JP | 2001-326370 A | 11/2001 |
| JP | 2007-165400 A | 6/2007 |
| JP | 2008-034686 A | 2/2008 |
| JP | 2008-141103 A | 6/2008 |
| JP | 2008-159794 A | 7/2008 |
| WO | 2008/018936 A2 | 2/2008 |

OTHER PUBLICATIONS

International Search Report (PCT/ISA/210) issued on Nov. 2, 2009, by Japanese Patent Office as the International Searching Authority for International Application No. PCT/JP2009/063941.

Written Opinion (PCT/ISA/237) issued on Nov. 2, 2009, by Japanese Patent Office as the International Searching Authority for International Application No. PCT/JP2009/063941.

Office Action (Notification of the Second Office Action) issued on Oct. 31, 2014, by the Chinese Patent Office in corresponding Chinese Patent Application No. 2009801607659, and an English translation of the Office Action. (7 pages).

* cited by examiner

METHOD OF FORMING ELECTRODES FOR A SOLAR BATTERY

FIELD

The present invention relates to a method for forming electrodes of a solar battery, a method for manufacturing a solar battery, and a solar battery. In particular, the present invention relates to a method for forming electrodes of a solar battery with the electrodes having a narrow line width and a large thickness, a method for manufacturing a solar battery, and a solar battery.

BACKGROUND

Conventionally, there is a method using screen printing as a typical method for forming light receiving face side electrodes of a solar battery. In the method using screen printing, a print paste is printed in a predetermined location on a silicon substrate using a print masking sheet (screen plate) having a permeable portion of a desired pattern, and is subjected to high-temperature treatment in a baking furnace to form light receiving face side electrodes.

Specifically, stainless-steel wires woven into a net, which is referred to as a screen mesh, are first stretched over a printing plate frame, pulled in the four directions tautly, and fixed thereon. A printing film is then made on the screen mesh, and meshes other than necessary picture lines (pattern of the permeable portion) are closed to form a screen plate. The formed screen plate is set in a screen printer. Further, a silicon substrate is set up with being registered on the screen plate.

A print paste is then put on the screen plate, and pressed and spread over the pattern of the permeable portion. Subsequently, a gumlike blade, which is referred to as a squeegee, is moved while pressurizing an inner printing film of the screen plate. In this way, the print paste permeates a screen mesh (pattern of the permeable portion) of a portion where the printing film is not formed, and is extruded on the silicon substrate positioned under the screen plate and adheres to the silicon substrate to form the desired pattern. After that, the print paste is dried and then baked. In this manner, light receiving face side electrodes of the desired pattern are formed. Since the printing plate can be used to easily form the pattern of the electrodes, this method is now used most widely. As the dimension of a pattern formed by such a method using the screen printing, about 100 μm to 200 μm in line width and about 10 μm to 20 μm in thickness are typical values.

On the other hand, rapid spread of a silicon solar battery to be expected hereafter causes concerns of shortage of silicon row materials. As a countermeasure to this, the power generation efficiency of the solar battery is improved to generate a larger amount of electric power from even the same amount of raw materials as in the conventional manner, and a price per electric power generation of the solar battery is decreased. Therefore, the number of production can be increased. There is a standard in which sizes of a substrate used for the silicon solar battery are standardized, and at present, 156 mm×156 mm is generally used. The improvement of power generation efficiency per substrate improves the power generation efficiency of the solar battery.

As one of methods for improving power generation efficiency, there is, for example, a method in which the wider substantial area of a light receiving face contributing to electric power generation on the substrate is ensured to increase the amount of a current obtained from one substrate. In general, as the area of the light receiving face is increased, the amount of currents generated in the solar battery is increased. On the other hand, the solar battery requires electrodes for collecting the generated currents and allowing the currents to pass therethrough. The electrodes have to be provided on a light receiving face side as long as any special methods are not used. For this reason, the electrodes become a barrier which shields the light receiving face. Accordingly, even in the case of electrodes which allow the current generated in the substrate to pass therethrough, it is necessary that any material shielding the light receiving face be formed so as to minimize its area, and that the area of a region contributing to electric power generation in the light receiving face be maximized, thereby to maximize the current to be obtained.

When grid electrodes having a narrow line width are formed by the conventional screen printing, a screen mesh is easy to be clogged with the print paste. In order to prevent this clogging, a print thickness has to be decreased. As a result, the cross-sectional area of the grid electrodes is decreased, and the electric resistance of the grid electrodes themselves is increased. Therefore, a large amount of current obtained in the substrate can not lead to increase of the power generation efficiency, and the output characteristics of the solar battery cannot be improved.

Furthermore, in the conventional screen printing, it has been necessary that an ink paste permeates the screen mesh. It has been very difficult that a single operation of printing makes the aspect ratio (electrode thickness/electrode width) of an electrode to be 0.3 or larger for the reason of securing a certain fluidity of the ink paste. To this end, the screen printing has been recently able to form an electrode having a line width of 80 μm, for example, but the aspect ratio has to be a value smaller than 0.3, for example, about 0.25, so that it is not able to realize making an electrode to have a narrower line width and a high aspect ratio together. When the aspect ratio of an electrode is equal to or smaller than 0.3, breaking probability is increased due to decrease in electrode thickness, or electrode resistance is increased due to decrease of a cross-sectional area of the electrode, thereby making it impossible to function as an appropriate electrode.

In order to form an electrode pattern having a large thickness, multiple overprints are required, and therefore improvement of release properties of a print paste from a screen plate as well as a print paste capable of being used for the multiple overprints is required. That is, in order to simultaneously make the line width of a grid electrode narrower and the film thickness of the electrode larger using the screen printing, an ink paste capable of multiple overprints is required. In addition, it is necessary that fluidity of the paste be limited and plate release properties from a screen plate be improved. Besides, this method complicates a print process, causes increase in used materials, rise in price, and increase in necessary time, and increases manufacturing cost greatly. Moreover, even if this method is used, due to characteristics of technique for extruding an ink paste from segments of picture lines provided in a screen plate to form a pattern, the cross section of an electrode becomes a barrel-vaulted shape spreading toward the bottom, so that an area which shields a light receiving face is increased. This leads to decrease in photoelectric conversion efficiency.

In order to form a grid electrode having a thickness satisfying the desired characteristics and a narrow line width, it is necessary that based on full knowledge of complexly interrelating characteristics such as a screen printer and printing conditions thereof, a screen plate and specifications thereof, and a print paste for screen printing, process conditions suitable for these characteristics be set. However, in fact, products used for manufacture of solar batteries, which are marketed from apparatus makers and material makers, are purchased and used to perform the manufacturing. Thus, the above-described process conditions are not followed, and a grid electrode having a desired shape cannot be formed. That is, the formation of an electrode by the screen printing has a limit.

On the other hand, there is a method utilizing pattern transfer as a method for forming a predetermined electrode pattern. Conventionally, photolithography for the manufacture of ICs and LSIs has been known as the pattern transfer. Recently, a method for pressing an original intaglio plate onto a substrate is tried in association with simplification of manufacture processes and cost reduction. For example, Patent Literature 1 describes a method for simply and economically performing high-precision pattern transfer utilizing light curing type nanoimprint.

CITATION LIST

Patent Literature

Patent Literature 1: Japanese Patent Application Laid-open No. 2007-165400
Patent Literature 2: Japanese Patent Application Laid-open No. 2008-34686
Patent Literature 3: Japanese Patent Application Laid-open No. 2008-141103

SUMMARY

Technical Problem

In any of the conventional method using photolithography and the method described in Patent Literature 1, an object to be patterned is a resist material. That is, a metal material in which a pattern is originally to be formed is subjected to etching technique, or the like, using a patterned resist pattern as a mask to form the pattern. Finally, the resist is removed to obtain a metal material having a desired shape. The reason why such a complex process must be employed is because even if the original intaglio plate is pressed against the metal material itself, a pattern cannot be transferred. For this reason, the complex process is required, in which a pattern is indirectly transferred to the metal material using the resist material as described above.

For example, Patent Literature 2 describes a method for pushing an original printing plate against the surface of a transparent electrode in a thin film solar battery to form a micron-order of irregularities thereon. However, this technique is not intended to transfer a line-shaped conductive pattern, and the irregularities are formed as a texture structure on the surface of an existing electrode. Therefore, an electrode itself cannot be formed by this technique.

Patent Literature 3 describes a method for pressing an original printing plate against a surface of an organic semiconductor layer to form a micron-order of irregularities thereon. However, as with Patent Literature 2, the electrodes of a solar battery cannot be formed by this technique.

The present invention has been achieved in view of the above, and an object of the present invention is to obtain a method for forming electrodes of a solar battery, a method for manufacturing a solar battery, and a solar battery, wherein the electrodes can be efficiently, simply and inexpensively formed.

Solution to Problem

In order to solve the above-mentioned problem and achieve the object, a method for forming an electrode of a solar battery according to the present invention is a method for forming an electrode of a solar battery on an electrode forming face of a semiconductor substrate, the method comprising: a first step of applying a resin containing a conductor material to be the electrode onto an electrode forming region of the electrode forming face; a second step of causing a pattern transfer member, on which a reverse pattern obtained by substantially reversing a pattern of the electrode is formed, to face the electrode forming face, and registering the pattern transfer member on a position in which the electrode is to be formed in the electrode forming face; a third step of pressing the pattern transfer member against the electrode forming face to transfer the electrode pattern to the resin containing the conductor material; a forth step of separating the pattern transfer member from the resin containing the conductor material; and a fifth step of baking the electrode pattern transferred to the resin containing the conductor material to form the electrode on the electrode forming face of the semiconductor substrate.

Advantageous Effects of Invention

According to the present invention, there are advantageous effects in which an electrode material is subjected to a single process of pattern transfer just once to be able to directly obtain a desired shape, and an electrode having a narrow line width and a thick film is obtained in good yield inexpensively by a simple process.

BRIEF DESCRIPTION OF DRAWINGS

FIG. 1-2 is a top view showing a general configuration of the solar battery cell according to the first embodiment of the present invention.

FIG. 1-3 is a bottom view showing a general configuration of the solar battery cell according to the first embodiment of the present invention.

FIG. 2-1 is a cross-sectional view illustrating a step of manufacturing the solar battery cell according to the first embodiment of the present invention.

FIG. 2-2 is a cross-sectional view illustrating a step of manufacturing the solar battery cell according to the first embodiment of the present invention.

FIG. 2-3 is a cross-sectional view illustrating a step of manufacturing the solar battery cell according to the first embodiment of the present invention.

FIG. 2-4 is a cross-sectional view illustrating a step of manufacturing the solar battery cell according to the first embodiment of the present invention.

FIG. 2-5 is a cross-sectional view illustrating a step of manufacturing the solar battery cell according to the first embodiment of the present invention.

FIG. 2-6 is a cross-sectional view illustrating a step of manufacturing the solar battery cell according to the first embodiment of the present invention.

FIG. 2-7 is a cross-sectional view illustrating a step of manufacturing the solar battery cell according to the first embodiment of the present invention.

FIG. 3-1 is a cross-sectional view illustrating a method for forming a light receiving face side electrode according to the first embodiment of the present invention.

FIG. 3-2 is a cross-sectional view illustrating the method for forming the light receiving face side electrode according to the first embodiment of the present invention.

FIG. 3-3 is a cross-sectional view illustrating the method for forming the light receiving face side electrode according to the first embodiment of the present invention.

FIG. 3-4 is a cross-sectional view illustrating the method for forming the light receiving face side electrode according to the first embodiment of the present invention.

FIG. 3-5 is a cross-sectional view illustrating the method for forming the light receiving face side electrode according to the first embodiment of the present invention.

FIG. 4 is a characteristic graph showing the correlation between an electrode line width and an electrode thickness under conditions for electrode formation.

FIG. 5 is a cross-sectional view illustrating an angle of inclination of the light receiving face side electrode in the method for forming a solar battery according to the first embodiment of the present invention.

FIG. 6-1 is a cross-sectional view illustrating a method for forming a light receiving face side electrode according to a second embodiment of the present invention.

FIG. 6-2 is a cross-sectional view illustrating the method for forming the light receiving face side electrode according to the second embodiment of the present invention.

FIG. 6-3 is a cross-sectional view illustrating the method for forming the light receiving face side electrode according to the second embodiment of the present invention.

FIG. 6-4 is a cross-sectional view illustrating the method for forming the light receiving face side electrode according to the second embodiment of the present invention.

DESCRIPTION OF EMBODIMENTS

Figure 1:
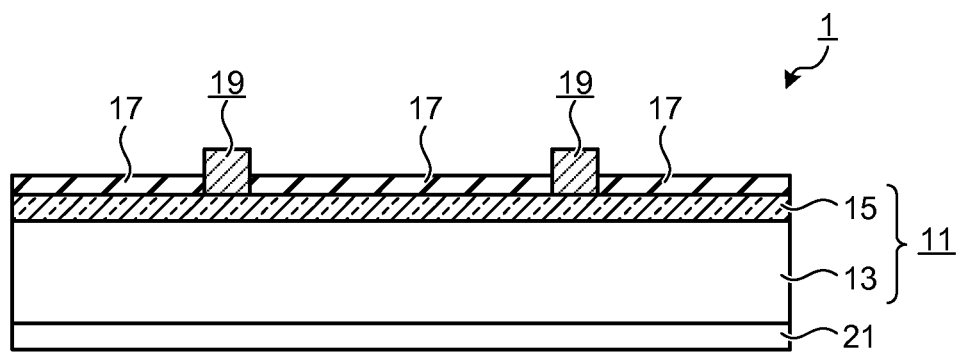
FIG. 1-1 is a cross-sectional view showing a general configuration of a solar battery cell according to a first embodiment of the present invention.

Hereinafter, embodiments of a method for forming electrodes of a solar battery, a method for manufacturing a solar battery, and a solar battery according to the present invention will be described in detail based on the drawings. The present invention is not limited to the following description, and the present invention can be appropriately modified without departing from the spirit of the present invention. Moreover, in order to easily understand the present invention, in the drawings referenced below, the scales of members may be different from those of the real members. The same applies to differences in scale among the drawings.

First Embodiment

Figures 1, 2:
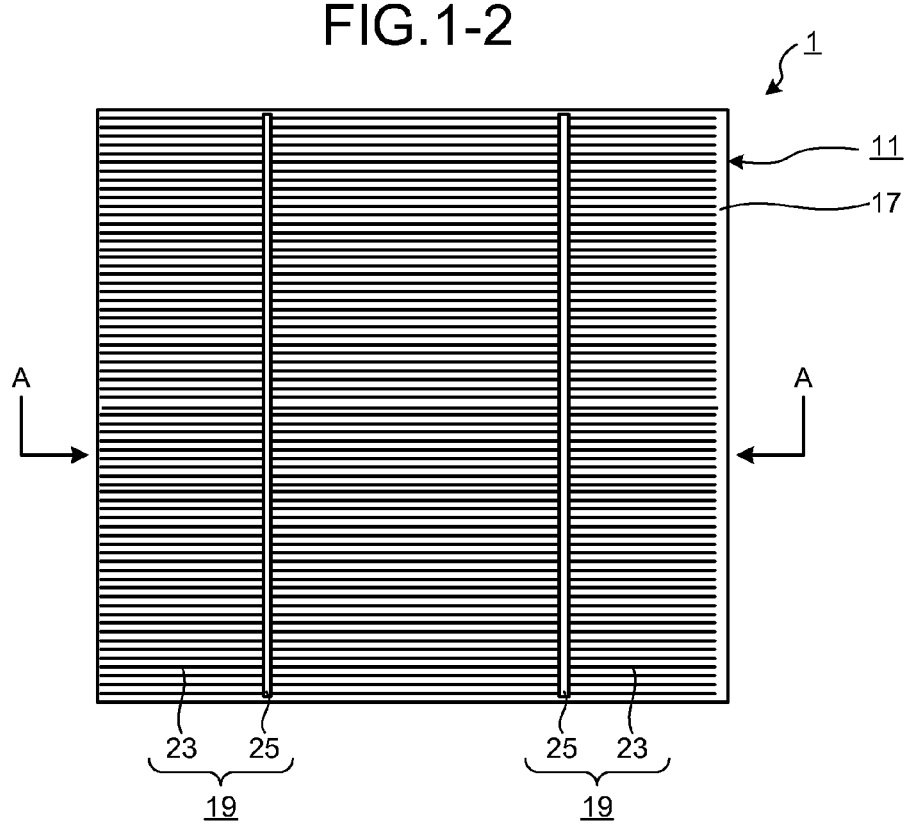
Figures 1, 2, 3:
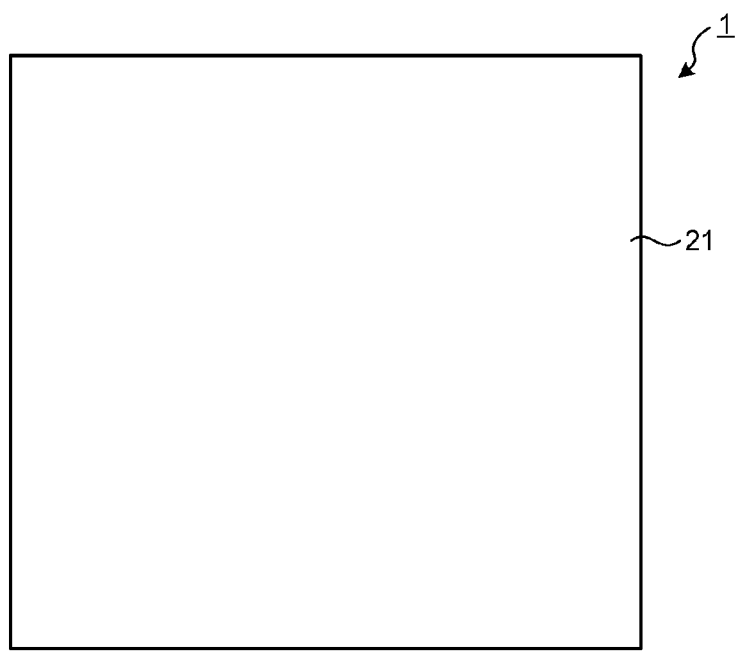

FIGS. 1-1 to 1-3 are views showing a general configuration of a solar battery cell 1 manufactured by a method for manufacturing a solar battery according to the present embodiment. FIG. 1-1 is a cross-sectional view of the solar battery cell 1. FIG. 1-2 is a top view of the solar battery cell 1 as viewed from a light receiving face side. FIG. 1-3 is a bottom view of the solar battery cell 1 as viewed from a side opposite to the light receiving face. FIG. 1-1 is a cross-sectional view along the A-A direction of FIG. 1-2.

As shown in FIGS. 1-1 to 1-3, the solar battery cell 1 comprises: a semiconductor substrate 11 which is a substrate of a solar battery having a photoelectric conversion function and has a p-n junction; an antireflection film 17 which is formed on a face (front surface) on a light receiving face side of the semiconductor substrate 11 and prevents the reflection of incident light on the light receiving face; light receiving face side electrodes 19 which are first electrodes formed on the face (front surface) on the light receiving face side of the semiconductor substrate 11 with being surrounded by the antireflection film 17; and a back side electrode 21 which is a second electrode formed on a face (back surface) opposite to the light receiving face of the semiconductor substrate 11.

The semiconductor substrate 11 includes a p-type (first conductive type) polycrystalline silicon layer 13, and an n-type (second conductive type) impurity diffusing layer 15 in which a conductivity type on the surface of the p-type polycrystalline silicon layer 13 is reversed. A p-n junction is formed by these layers. The light receiving face side electrode 19 includes a front silver grid electrode 23 and a front silver bus electrode 25 of a solar battery cell. The front silver grid electrode 23 is locally provided on the light receiving face to collect electricity generated in the semiconductor substrate 11. The front silver bus electrode 25 is provided substantially perpendicular to the front silver grid electrodes 23 to take out the electricity collected in the front silver grid electrodes 23. Further, the back side electrode 21 is formed on the entire back face of the semiconductor substrate 11.

In the solar battery cell 1 thus constituted, when a p-n junction plane of the semiconductor substrate 11 (junction plane between the p-type polycrystalline silicon layer 13 and the n-type impurity diffusing layer 15) is irradiated with sunlight from the light receiving face side of the solar battery cell 1, holes and electrons are generated. By the electric field of the p-n junction portion, the generated electrons move toward the n-type impurity diffusing layer 15, and the holes move toward the p-type polycrystalline silicon layer 13. This causes an excess of electrons in the n-type impurity diffusing layer 15 and an excess of holes in the p-type polycrystalline silicon layer 13. As a result, photovoltaic power is generated. This photovoltaic power is generated in a direction wherein the p-n junction is biased in the forward direction, the light receiving face side electrode 19 connected to the n-type impurity diffusing layer 15 becomes a negative electrode and the back side electrode 21 connected to the p-type polycrystalline silicon layer 13 becomes a positive electrode, thereby allowing a current to flow in an external circuit not shown.

In the solar battery cell 1 according to the first embodiment constituted as described above, the front silver grid electrode 23 is formed as a fine line electrode having form of a fine line and a thick film, in which the electrode 23 has a line width of about 40 µm and a thickness of about 40 µm (aspect ratio=1), and a side wall is provided substantially perpendicular thereto, so that the area in which the light receiving face is shielded is reduced as much as possible. Therefore, in the solar battery cell 1 according to the first embodiment, the substantial area of the light receiving face contributing to electric power generation in the semiconductor substrate 11 is increased and much ensured, and accordingly, the amount of current obtained from the solar battery cell 1 is increased to achieve the improvement in the output characteristics.

Further, since the front silver grid electrode 23 is formed to have not only the narrow line width but also the large thickness, the cross-sectional area thereof is kept large. In this way, decrease in the line width of the front silver grid electrode 23 results in the electric resistance of the front silver grid electrode 23 itself being prevented from increasing, and power generation efficiency can be increased due to the generated current to achieve the improvement in the output characteristics.

Therefore, the solar battery cell 1 according to the first embodiment is provided with the narrow-line-width and thick film front silver grid electrode 23 as the light receiving face side electrode 19, so that the light receiving area is kept wide, and a solar battery cell superior in photoelectric conversion efficiency is realized.

Figures 1, 2:
Figure 2:
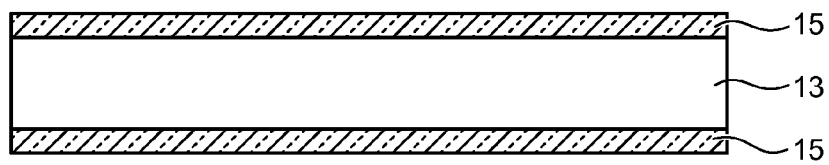
Figures 2, 3:
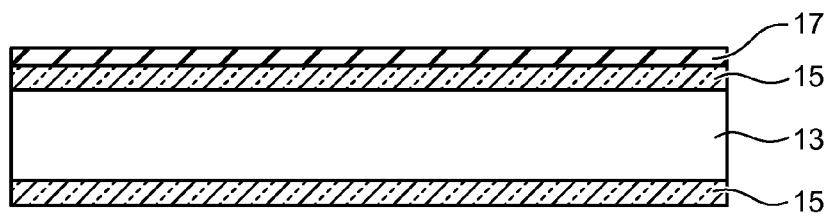
Figures 2, 3, 4:
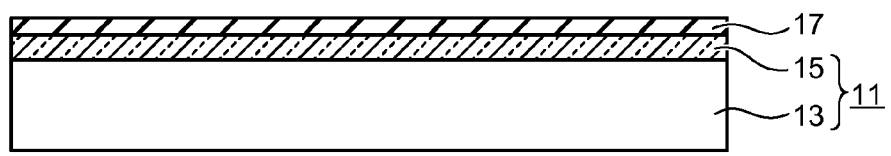

Next, one example of a method for manufacturing such a solar battery cell 1 will be described with reference to FIGS. 2-1 to 4. FIGS. 2-1 to 2-7 each are a cross-sectional view illustrating a manufacturing step of the solar battery cell 1 according to the first embodiment.

As a semiconductor substrate, for example, a p-type polycrystalline silicon substrate (hereinafter referred to as a p-type polycrystalline silicon substrate 11a) which is used most frequently as a consumer solar battery is prepared (FIG. 2-1).

Since the p-type polycrystalline silicon substrate 11a is manufactured by slicing an ingot obtained by cooling and solidifying melted silicon material, with a wire saw, there remain damages caused in the slicing on its surface. In order to simultaneously remove this damaged layer, the p-type polycrystalline silicon substrate 11a is immersed in an acidic solution or a heated alkaline solution, for example, an aqueous solution of sodium hydroxide to etch the surface, so as to remove a damaged region existing near the surface of the p-type polycrystalline silicon substrate 11a, generated during cutting out of the silicon substrate.

Further, at the same time as or after the removal of the damage, fine irregularities may be formed (not shown) as a texture structure on the surface on the light receiving face side of the p-type polycrystalline silicon substrate 11a. By such a texture structure is provided on the light receiving face side of the p-type polycrystalline silicon substrate 11a, multiple reflection of the light is caused on the surface side of the solar battery cell 1, and incident light upon the solar battery cell 1 can be efficiently adsorbed into inside of the semiconductor substrate 11. Accordingly, the reflectance can be effectively decreased to improve conversion efficiency.

Since the present invention is an invention relating to the electrode formation, formation method or shape of the texture structure is not particularly limited. Accordingly, any techniques may be used, for example, including a method using an alkaline aqueous solution containing isopropyl alcohol, or acid etching based on a mixed solution mainly containing hydrofluoric acid and nitric acid, a method in which a mask member partially having openings is formed on the surface of the p-type polycrystalline silicon substrate 11a, and etching is performed through the mask member to obtain a honeycomb structure and/or an inverted pyramid structure on the surface of the p-type polycrystalline silicon substrate 11a, or a technique using reactive gas etching (RIE: Reactive Ion Etching).

Next, the p-type polycrystalline silicon substrate 11a is put into a thermo-oxidative furnace, and heated under an atmosphere of phosphorus (P) which is an n-type impurity. In this step, phosphorus (P) is diffused in the surface of the p-type polycrystalline silicon substrate 11a to form an n-type impurity diffusing layer 15, and a semiconductor p-n junction is formed (FIG. 2-2). In the present embodiment, the p-type polycrystalline silicon substrate 11a is heated under an atmosphere of phosphorus oxychloride ($POCl_3$) gas at a temperature of, for example, 800° C. to 850° C., thereby to form n-type impurity diffusing layer 15.

Since a phosphorous glass layer containing glass as a main component is formed on the surface of the n-type impurity diffusing layer 15 immediately after the formation of the layer 15, the phosphorous glass layer is removed using a hydrofluoric acid solution or the like.

Next, a silicon nitride film (SiN film) is formed as the antireflection film 17 on the light receiving face side of the p-type polycrystalline silicon substrate 11a in which the n-type impurity diffusing layer 15 is formed, order to improve the photoelectric conversion efficiency (FIG. 2-3). For example, a plasma CVD method is used for the formation of the antireflection film 17, and a mixed gas of silane and ammonia is used to form the silicon nitride film as the anti-reflection film 17. The film thickness and refractive index of the antireflection film 17 are set to values intended to suppress light reflection most strongly. As the antireflection film 17, two or more films having different refraction indexes may be stacked. Further, for the formation of the antireflection film 17, a different film forming method such as a sputtering method may be used. As the antireflection film 17, a silicon oxide film may be formed.

Subsequently, the n-type impurity diffusing layer 15 formed on the back face of the p-type polycrystalline silicon substrate 11a due to the diffusion of phosphorus (P) is removed. Thus, the semiconductor substrate 11, in which the p-n junction is formed by the p-type polycrystalline silicon layer 13 that is a first conductive type layer and the n-type impurity diffusing layer 15 that is a second conductive type layer, which is formed on the light receiving face side of the p-type polycrystalline silicon layer 13, is obtained (FIG. 2-4).

The n-type impurity diffusing layer 15 formed on the back face of the p-type polycrystalline silicon substrate 11a is removed by a one-side etching apparatus, for example. While the antireflection film 17 is employed as a mask material, a method for immersing the entire p-type polycrystalline silicon substrate 11a in an etchant may be used. As the etchant, a solution obtained by heating an alkaline aqueous solution such as sodium hydroxide or potassium hydroxide at room temperature up to 95° C., preferably between 50° C. to 70° C., is used. In addition, as the etchant, a mixed aqueous solution of nitric acid and hydrofluoric acid may be used.

Next, the light receiving face side electrode 19 (before baking), that is, a pattern (ante-baking) of the front silver grid electrode 23 and the front silver bus electrode 25 is formed on the antireflection film 17 (FIG. 2-5). In the present embodiment, a pattern of the light receiving face side electrode 19 is formed by transfer as described below. Hereinafter, a method for forming the light receiving face side electrode 19 using pattern transfer will be described with reference to FIGS. 3-1 to 3-5. FIGS. 3-1 to 3-5 each are a cross-sectional view illustrating the method for forming the light receiving face side electrode 19 according to the first embodiment based on pattern transfer.

First, a thermoplastic resin 19a containing a conductor which is an electrode material of the light receiving face side electrode 19 is applied to the antireflection film 17 of the semiconductor substrate 11 (FIG. 3-1). A method for applying the thermoplastic resin 19a to the antireflection film 17 is not particularly limited, and various methods can be used as long as the thermoplastic resin 19a can be applied to the antireflection film 17 in a desired state. For example, techniques such as offset printing or screen printing may be used. Further, by applying the thermoplastic resin 19a only to the formation region of the light receiving face side electrode 19 on the antireflection film 17, materials to be used can be reduced. In the case where the thermoplastic resin 19a is selectively applied only to the formation region of the light receiving face side electrode 19 on the antireflection film 17, the thermoplastic resin 19a has to be applied to a region corresponding to positions in which the light receiving face side electrodes 19 are formed.

As the conductor contained in the thermoplastic resin 19a, metal materials such as silver (Ag), gold (Au), copper (Cu), silver-palladium (Ag—Pd) and indium-tin (In—Sn) can be used. For a resin used for the thermoplastic resin 19a, many thermoplastic resins such as polyethylene-based resins, polypropylene-based resins, polystyrene-based resins and polycarbonate-based resins can be used. The thermoplastic resin 19a is applied to a region containing at least the shape of the light receiving face side electrode 19, that is, the shape of the front silver grid electrode 23 having form of a long fine line and a thick film, and the shape of the band-shaped front silver bus electrode 25 substantially perpendicular to this pattern.

Next, the semiconductor substrate 11 to which the thermoplastic resin 19a has been applied is placed on a heating stage 31 with its face to which the thermoplastic resin 19a has been applied being directed upward. The semiconductor substrate 11 is subjected to heat treatment in this situation by the heating stage 31 (FIG. 3-2). The thermoplastic resin 19a is subjected to this heat treatment, and then softened. After that, the temperature of the semiconductor substrate 11 rises to a specific temperature (a temperature which is equal to or higher than the softening temperature of the thermoplastic resin 19a), and the thermoplastic resin 19a is softened. Then, an original intaglio plate 32 that is a pattern transfer member is caused to face an electrode forming face (thermoplastic resin 19a) of the semiconductor substrate and is registered on the positions in which the light receiving face side electrodes 19 are formed in the electrode forming face (thermoplastic resin 19a). Further, the original intaglio plate 32 is pressed against the thermoplastic resin 19a (FIG. 3-3). In this time, the entire region of the original intaglio plate 32 in an in-plane direction is uniformly pressed, and thereby the entire light receiving face of the semiconductor substrate 11 is pressed uniformly by the original intaglio plate 32.

Herein, a reverse pattern obtained by substantially reversing the pattern of the light receiving face side electrode 19, i.e., a reverse pattern obtained by substantially reversing the pattern of the front silver grid electrode 23 and the front silver bus electrode 25, is formed on the original intaglio plate 32 in advance. Further, a pressure (pressing pressure) for pressing the original intaglio plate 32 against the thermoplastic resin 19a is measured with a pressure sensor or the like, and kept to a specific pressure. It is preferable that the pressing pressure when a resin containing silver is used as the thermoplastic resin 19a containing a conductor be, for example, a pressure of 0.1 Mpa to 1 Mpa. This reason is as follows. When the pressing pressure is smaller than 0.1 Mpa, the pattern may be blurred, and linearity of a linear shape may be impaired. On the other hand, when the pressing pressure is larger than 1 Mpa, the aspect ratio of the pattern may be uneven, and in some cases a semiconductor substrate may be destroyed.

Figures 2, 3, 4, 5:
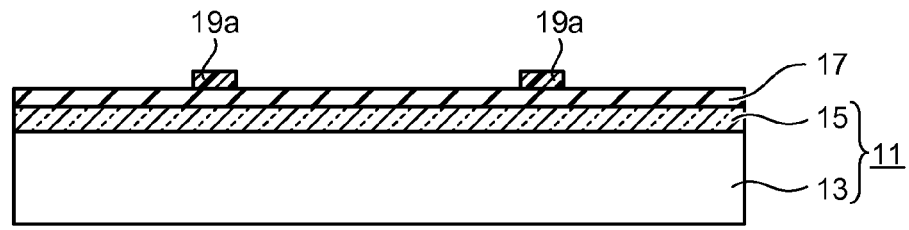

Next, the semiconductor substrate 11 is placed on a cooling stage 33, and cooled (FIG. 3-4). Then, after the temperature of the semiconductor substrate 11 drops to a specific temperature and the thermoplastic resin 19a is solidified, the original intaglio plate 32 is separated from the thermoplastic resin 19a. In this way, the pattern of the light receiving face side electrode 19, that is, the pattern of the front silver grid electrode 23 and the front silver bus electrode 25 is transferred to the thermoplastic resin 19a (FIG. 3-5). In other words, as the light receiving face side electrode 19, the front silver grid electrode 23 and the front silver bus electrode 25 are formed on the antireflection film 17 (before baking).

The original intaglio plate 32 having the formed reverse pattern obtained by substantially reversing the pattern of the light receiving face side electrode 19, i.e., the reverse pattern obtained by substantially reversing the pattern of the front silver grid electrode 23 and the front silver bus electrode 25 is prepared in advance. Then, the reverse pattern formed on the original intaglio plate 32 is transferred to the thermoplastic resin 19a. Accordingly, in a direct manufacture step of the light receiving face side electrode 19 in the semiconductor substrate 11, a printing step of a material paste for the light receiving face side electrode as in a conventional method is replaced with a pattern transfer step, and so unnecessary. A drying step of the material paste for the light receiving face side electrode which is required together with the printing step as a set is also unnecessary. Further, since the entire light receiving face of the semiconductor substrate 11 is pressed uniformly by the original intaglio plate 32, occurrence of cracking or chipping of the semiconductor substrate 11 is suppressed, thereby making it possible to improve a yield.

After that, the semiconductor substrate 11, to which the thermoplastic resin 19a has been applied, and which is an object to be processed next, is placed on the heating stage 31, and the above-described treatment is repeated.

After the formation of the light receiving face side electrode 19 (before baking), a back side electrode material paste 21a containing aluminum (Al), glass, or the like, which is an electrode material of the back side electrode 21, is subjected to screen printing on the entire back face of the semiconductor substrate 11, and is dried, for example, at 100° C. to 300° C. (FIG. 2-6).

Then, the semiconductor substrate 11 is baked, for example, at 700° C. to 1000° C. to form the light receiving face side electrode 19 and the back side electrode 21 (FIG. 2-7). Further, silver in the light receiving face side electrode 19 penetrates the antireflection film 17, and the n-type impurity diffusing layer 15 is electrically connected to the light receiving face side electrode 19.

By carrying out the above-described steps, the solar battery cell 1 according to the first embodiment, shown in FIGS. 1-1 to 1-3 can be manufactured. The order of arrangement of the paste which is an electrode material to the semiconductor substrate 11 on the light receiving side may be replaced with that on the back side.

According to the method for forming the solar battery according to the above-described first embodiment, the electrode dimension is from micron order to several tens of micron order, and an electrode whose dimension accuracy is micron order can be formed. According to such a method for forming the solar battery according to the above-described first embodiment, for example, a front silver grid electrode 23 having a line width of 10 μm to 90 μm, an electrode thickness of 10 μm to 90 μm, and an aspect ratio (electrode thickness/ electrode width) of 0.35 to 1 can be formed. That is, a front silver grid electrode 23 having very narrower line width and thicker film form can be formed as compared with an electrode dimension of a line width of about 100 μm to 200 μm, and a thickness of about 10 μm to 20 μm, which is formed by a method using the conventional screen printing. Herein, an electrode thickness and an aspect ratio (electrode thickness/ electrode width) each have a different appropriated value depending on the line width of an electrode to be designed.

Further, in the case of using a resin containing silver as the thermoplastic resin 19a containing a conductor, the electrode width of the front silver grid electrode 23 is preferably 40 μm to 80 μm. Herein, the reason why the electrode width of the front silver grid electrode 23 is preferably 40 μm to 80 μm is as follows. By the method for forming the solar battery according to the present embodiment, an electrode having a line width of 10 μm to 90 μm, an electrode thickness of 10 μm to 90 μm, and an aspect ratio (electrode thickness/electrode width) of 0.35 to 1 can be formed as described above.

However, in the case of using a resin containing silver as the thermoplastic resin 19a containing a conductor, when the cross-sectional area of the electrode is smaller than a certain value, the resistance value of the electrode is increased enough to affect the characteristics of the solar battery. Therefore, in the method for forming the solar battery according to the first embodiment, an electrode having a shape satisfying the above-described conditions can be formed, but in the case of using a resin containing silver as the thermoplastic resin 19a containing a conductor, the electrode width of the front silver grid electrode 23 is preferably 40 µm to 80 µm.

Further, in the method for forming the solar battery according to the first embodiment, the aspect ratio (electrode thickness/electrode width) higher than 1 can be realized, but it is in an excessive specification as an electrode structure. Particularly, when the electrode line width is a line width as very narrow as 50 µm or smaller, occurrence probabilities of destruction of formed electrodes and decrease in adhesion strength between the electrode and a lower layer are increased, so that this electrode cannot function properly.

On the other hand, in the method for forming the solar battery according to the first embodiment, the aspect ratio (electrode thickness/electrode width) smaller than 0.35 can be realized. Although the required aspect ratio varies depending on a line width to be designed, when the aspect ratio (electrode thickness/electrode width) is smaller than 0.35, the cross-sectional area of the electrodes is decreased, and the electric resistance of the electrodes themselves is increased. Therefore, the power generation efficiency cannot be increased even with a large current obtained in the substrate, and the output characteristics of the solar battery cannot be improved. In particular, when the aspect ratio (electrode thickness/electrode width) of the electrode is equal to or smaller than 0.3, the breaking probability is increased due to decrease in electrode thickness, and/or the electrode resistance is increased due to decrease in electrode cross-sectional area, resulting in this electrode being unable to function properly.

Therefore, from the viewpoint of function, the aspect ratio (electrode thickness/electrode width) of the electrode is preferably in a range of 0.35 to 1. If the aspect ratio (electrode thickness/electrode width) of the electrode falls within this range, then disconnection of the electrode does not occur, and the resistance value of the electrode itself stabilizes to a value inherent in the material, so that the occurrence probabilities of destruction of formed electrodes and decrease in adhesion strength between the electrode and a lower layer are not increased.

FIG. 4 is a view of characteristics showing the correlation between the electrode line width and the electrode thickness in conditions of electrode formation. First, the maximum aspect ratio, in which the electrode can function properly, is 1. For this reason, in FIG. 4, a range (including the line α) below a line α showing an aspect ratio of 1 is a preferable range. Further, as described above, the electrode must retain a resistance value equal to or smaller than a certain value. For this reason, a range (including the line β) above a line β showing an aspect ratio of 0.35 is a preferable range. Further, the electrode must ensure its cross-sectional area equal to or larger than a certain area. Therefore, a range (including the line γ) above a line γ in which a value obtained by multiplying values of electrode thickness and electrode line width is 1000 µm² is a range recommended as an electrode shape. Further, in the case of using a resin containing silver as the thermoplastic resin 19a containing a conductor, the electrode line width of the front silver grid electrode 23 is preferably 40 µm to 80 µm because of the above-described reason. Therefore, a range δ in FIG. 4 is a most preferable range as an electrode formation condition. Specifically, conditions of, for example, a line width of 40 µm and a thickness of 40 µm (aspect ratio = 1), and a line width of 80 µm and a thickness of 30 µm (aspect ratio=0.375) are exemplified.

On the other hand, in the method for forming the solar battery according to the first embodiment, as shown in FIG. 5, an angle θ formed between a side wall along the longitudinal direction of the electrode and the semiconductor substrate 11 (antireflection film 17) (hereinafter referred to as an angle of inclination) is 60° to 90°. By setting the angle of inclination to 60° to 90°, the cross-sectional shape of the electrode becomes a shape which does not spread toward the bottom and in which a side wall is almost upright, so that the area which shields the light receiving face is widened due to the cross-sectional shape of the electrode and it is possible to prevent the photoelectric conversion efficiency from decreasing, and accordingly, the photoelectric conversion efficiency is increased. FIG. 5 is a cross-sectional view illustrating an angle of inclination of the light receiving face side electrode 19 formed in the method for forming the solar battery according to the first embodiment.

In the conventional screen printing, the end of the cross-section of an electrode has a shape spreading toward the bottom due to fluidity of an ink paste and/or interaction with a screen plate, so that in most cases, the angle is smaller than 30°. From the cross-section of the electrode at this situation, although the proportion of a portion spreading toward the bottom to the line width is up to about 40%, the proportion of the portion to the cross-sectional area is less than 20%.

That is, in the conventional screen printing, a part having a great thickness, which intrinsically functions as an electrode, is formed, and at the same time, a part which only serves as an entity shielding the light receiving face is formed. In this circumstance, when the line width of the electrode becomes narrower, the aspect ratio (electrode thickness/electrode width) is inevitably smaller than the conventional one. Accordingly, the electrode thickness is decreased and the electrode resistance is increased, and so it is difficult for the electrode to function sufficiently. In contrast, in the method for forming the solar battery according to the first embodiment, the angle of inclination is set to 60° to 90°, and so these problems are not caused.

Herein, in the method for forming the solar battery according to the first embodiment, the upper limit of the angle of inclination is 90°. The ideal cross-sectional shape of the electrode is a square having an aspect ratio of 1, in which a ratio between an electrode line width and an electrode thickness is 1:1. However, an angle more than it cannot be formed due to the characteristics of used materials. Even if an electrode having an angle of inclination more than the upper limit is formed (in this case, the angle of inclination leads to overhang), as with the case where the aspect ratio (electrode thickness/electrode width) is higher than 1, the formed electrode is destroyed and adhesion strength between the electrode and a lower layer is decreased, and so it is difficult for the electrode to function sufficiently.

In the method for manufacturing the solar battery cell according to the first embodiment, as described above, a fine line electrode having a line width of 70 µm and a cross-sectional area equivalent to the conventional one can be formed. In a conventional method for forming an electrode using the screen printing, an electrode line width of about 120 µm is required to make the line width narrower while keeping a good aspect ratio. That is, in the method for forming the solar battery according to the first embodiment, the wider area of a light receiving region contributing to electric power generation can be ensured in the light receiving face. As a result, in the solar battery cell 1 formed by the method for manufacturing the solar battery cell according to the first embodiment, the light receiving area is increased by 2.2%, and thereby a current value per unit area is increased by 0.7 mA, and the convention efficiency per sheet of solar battery cell is increased by 0.5%, as compared with a solar battery cell having the same structure having electrodes formed using the screen printing.

As discussed above, in the method for manufacturing the solar battery cell according to the first embodiment, the original intaglio plate 32 is pressed against the thermoplastic resin 19a applied on the antireflection film 17 of the semiconductor substrate 11, and a pattern of the light receiving face side electrode 19 is thereby transferred to the thermoplastic resin 19a to form the pattern of the light receiving face side electrode 19. That is, the pattern of the light receiving face side electrode 19 is formed directly on the antireflection film 17 of the semiconductor substrate 11.

By adopting such a technique, in a step of directly manufacturing the light receiving face side electrode 19 on the semiconductor substrate 11, a printing step for a material paste for the light receiving face side electrode, that has been used in the conventional art, is replaced with a pattern transfer step, and therefore becomes unnecessary. A drying step for the material paste for the light receiving face side electrode that has been required together with the printing step as a set also becomes unnecessary. Further, since the entire light receiving face of the semiconductor substrate 11 is pressed uniformly by the original intaglio plate 32, there is not a moving step while pressurizing as in the screen printing. Accordingly, occurrence of cracking and/or chipping of the semiconductor substrate 11 is suppressed, and a yield can be improved. Further, when such a technique is employed, an electrode pattern which is not blurred and is perpendicular can be formed even on a substrate whose surface is not smooth.

Further, in the method for manufacturing the solar battery cell according to the first embodiment, since an electrode having a range of an aspect ratio of 0.35 to 1 and an angle of inclination of 60° to 90° can be formed, an electrode having a narrower line width and a greater thickness can be manufactured at lower cost with higher precision than those of the conventional one. That is, the pattern of the formed light receiving face side electrode 19 does not become a shape in which the cross-section of an electrode takes the form of a barrel-vaulted shape spreading toward the bottom, as in the case of using the screen printing. Therefore, this can prevent the photoelectric conversion efficiency from decreasing due to the increase of the area shielding the light receiving face, resulting from the cross-sectional shape of the electrode, and accordingly, the photoelectric conversion efficiency is increased.

Further, since an electrode having a range of angle of inclination of 60° to 90° can be formed, an electrode having much the same cross-sectional area as in the conventional one can be created while having a line width narrower than that of the conventional one. That is, the bottom area (the area on light receiving face) required to form an electrode having the same cross-sectional area can be reduced, and the area of a light receiving region contributing to electric power generation can be widened in the light receiving face by the reduced area. Therefore, in the method for manufacturing the solar battery cell according to the first embodiment, the wider area of the light receiving region contributing to electric power generation can be ensured in the light receiving face, and the photoelectric conversion efficiency per sheet of the solar battery cell is increased. A solar battery cell superior in photoelectric conversion efficiency can thereby be manufactured.

Further, although the original intaglio plate 32 used in the method for manufacturing the solar battery cell according to the first embodiment cannot be used permanently, the cost can be reduced since the durable number of the print plate significantly exceeds that of a screen plate used in the screen printing. Further, since the dimension accuracy of the manufactured electrode pattern has little difference between the time when starting use of the original intaglio plate 32 and the time after completion of using it, the dimension accuracy of the electrode pattern does not so vary depending on the number of times the original intaglio plate 32 is used, and an electrode having a high accuracy can thereby be manufactured.

Therefore, according to the method for manufacturing the solar battery cell according to the first embodiment, a desired shape of a pattern can be directly obtained by performing a single process of pattern transfer to an electrode material just once without accompanying the indirect pattern formation as in a conventional method. For this reason, a complex process as in the conventional method is unnecessary, and an electrode having form of a narrow line width and a thick film can be formed in a good yield inexpensively by a simple process.

Second Embodiment

Figures 2, 3, 4, 5, 6:
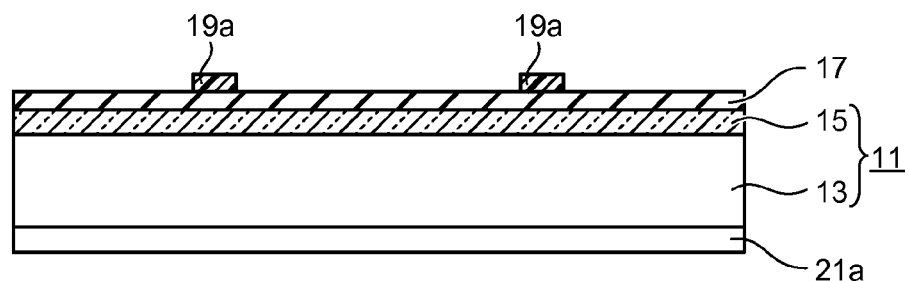
Figures 2, 3, 4, 5, 6, 7:
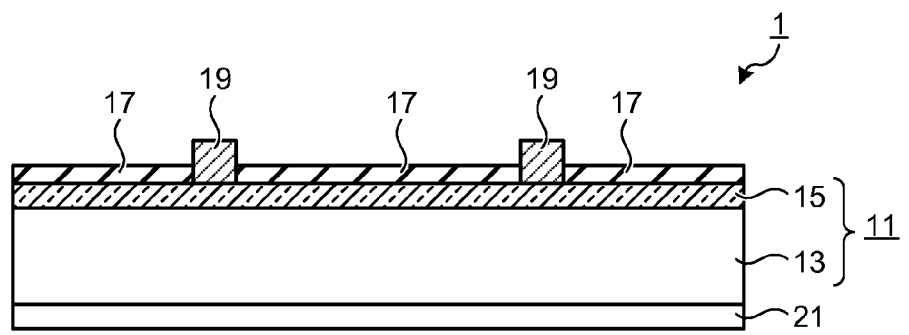
Figures 1, 3:
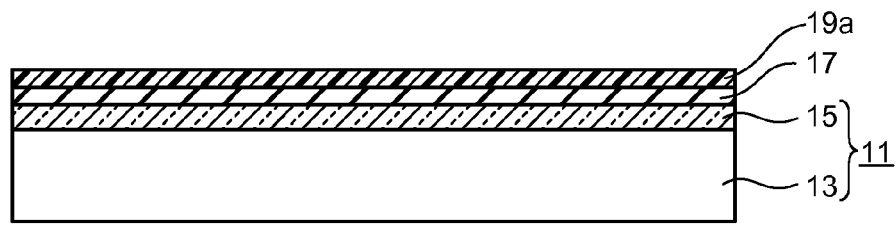
Figures 2, 3:
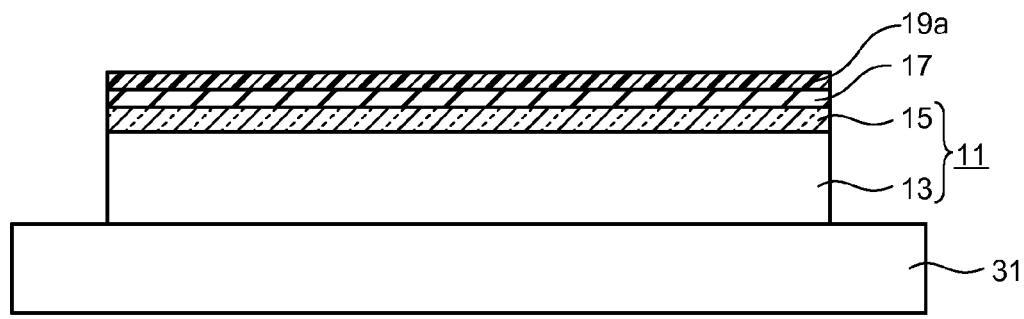
Figure 3:
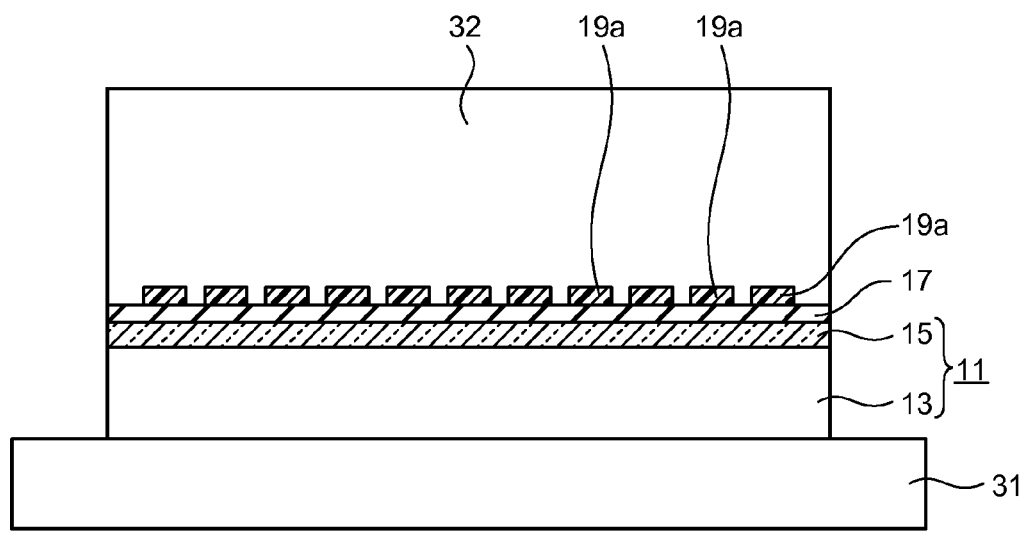
Figures 3, 4:
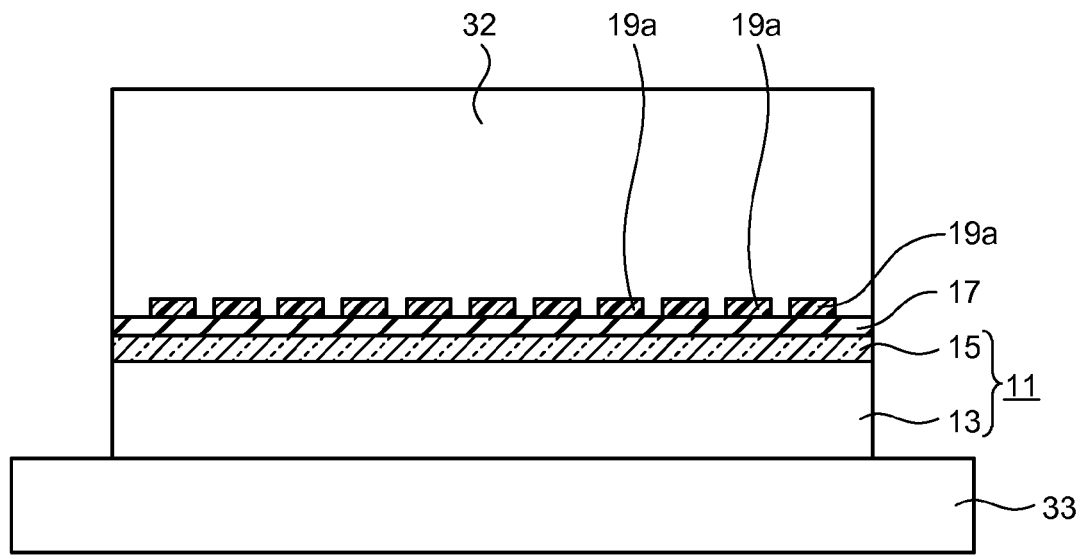
Figures 3, 4, 5:
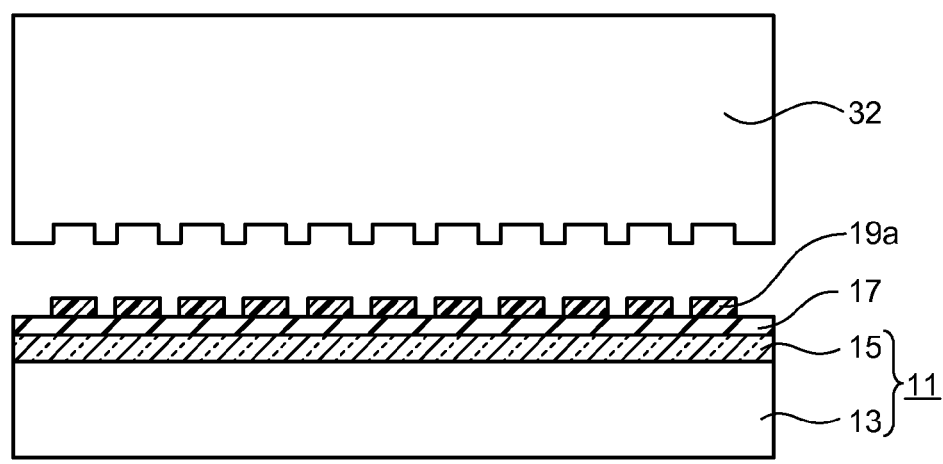
Figure 4:
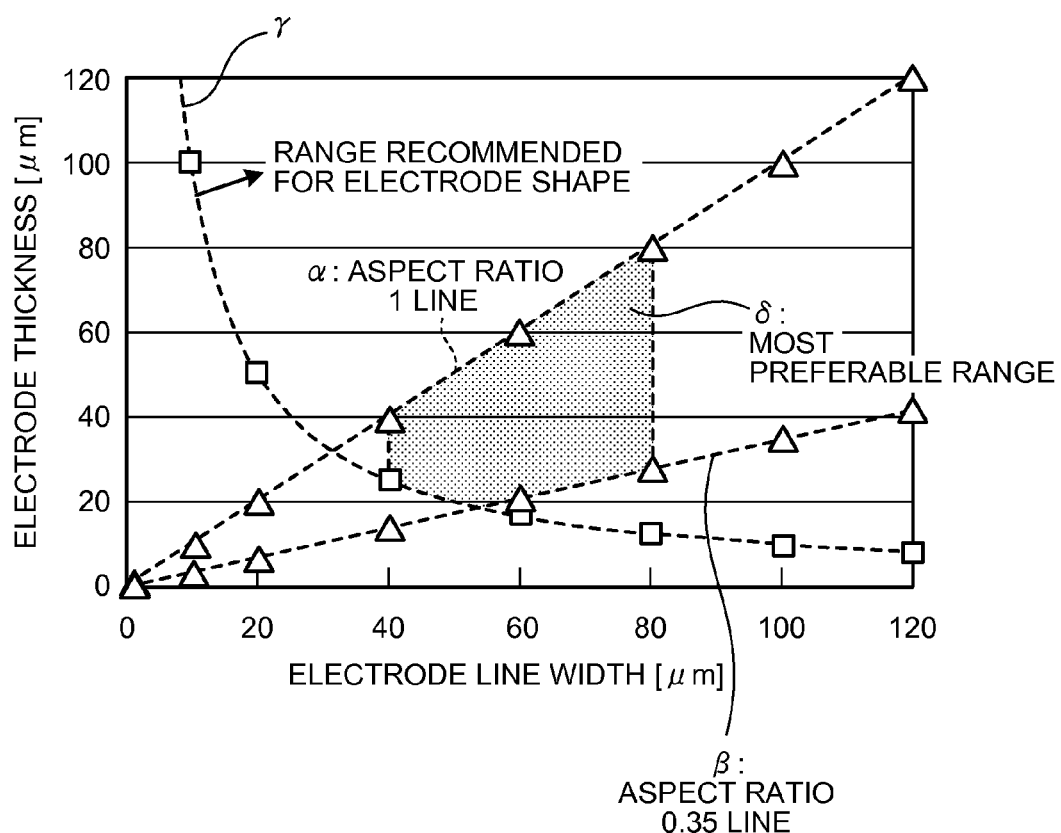
Figure 5:
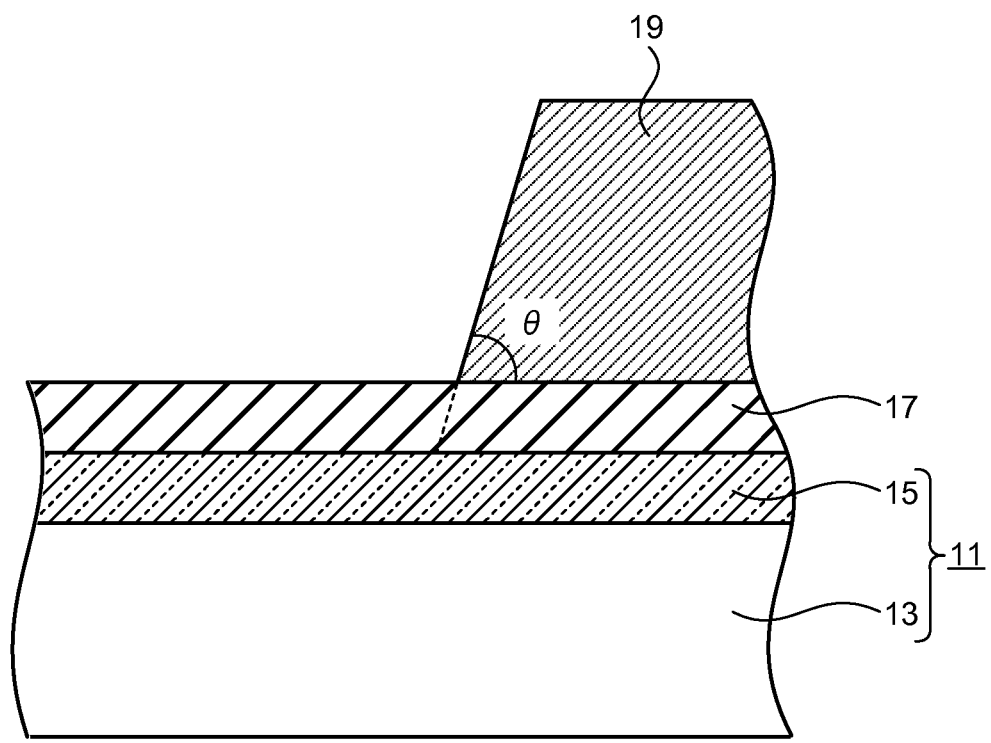
Figures 1, 6:
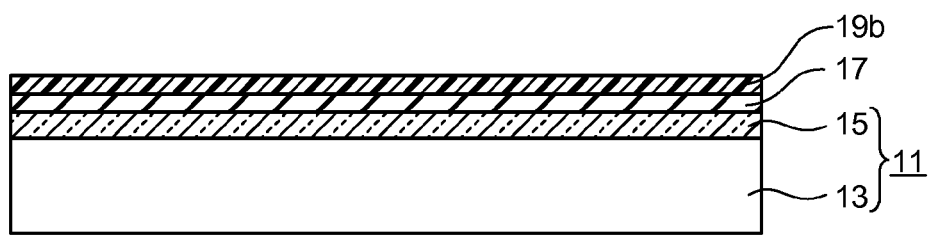
Figures 2, 6:
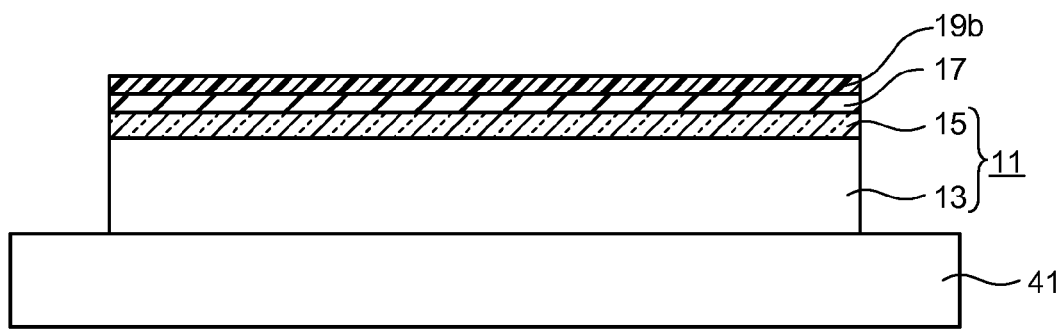
Figures 3, 6:
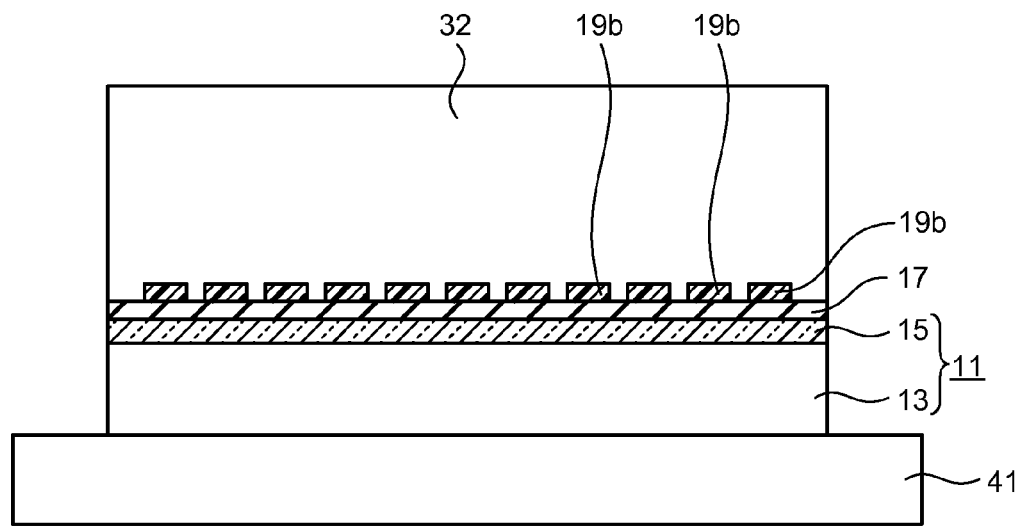
Figures 4, 6:
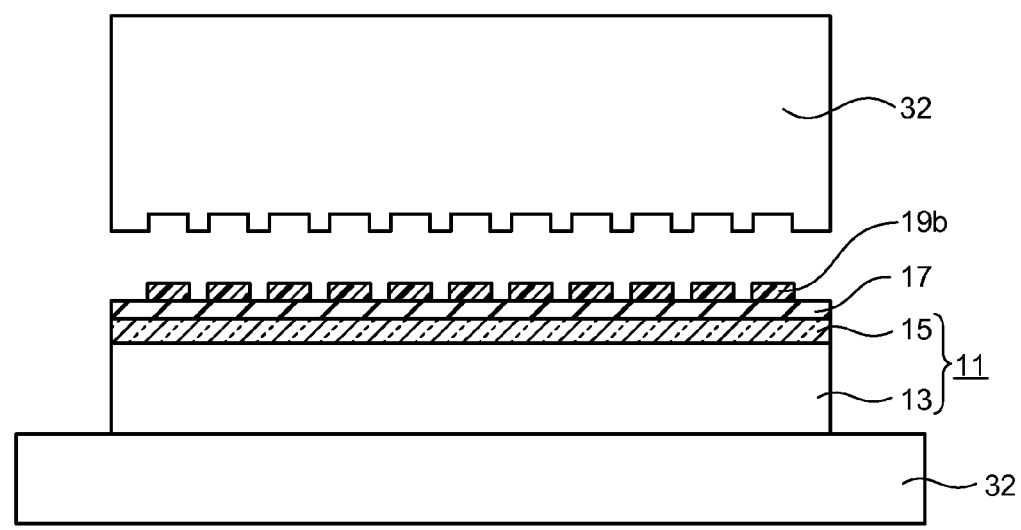

A second embodiment will describe a modification example of the method for manufacturing the solar battery cell described in the first embodiment. Herein, a basic process of a method for manufacturing a solar battery cell according to the second embodiment is the same as in the first embodiment. Therefore, a method for forming a light receiving face side electrode 19 in the method for manufacturing a solar battery cell according to the second embodiment will be described below with reference to FIGS. 6-1 to 6-4. FIGS. 6-1 to 6-4 each are a cross-sectional view schematically illustrating the method for forming a light receiving face side electrode 19 according to the second embodiment based on pattern transfer.

First, as shown in FIG. 2-4 in the first embodiment, an antireflection film 17 is formed on a semiconductor substrate 11. Next, a photocurable resin 19b containing a conductor material, which is an electrode material of the light receiving face side electrode 19, is applied onto the antireflection film 17 of the semiconductor substrate 11 (FIG. 6-1). A method for applying the photocurable resin 19b onto the antireflection film 17 is not particularly limited, and various methods can be used as long as the photocurable resin 19b can be applied onto the antireflection film 17 in a desired state. For example, techniques such as offset printing and screen printing may be used. Further, by applying the photocurable resin 19b only to a formation region for the light receiving face side electrode 19 on the antireflection film 17, the materials to be used can be reduced. It is noted that when the photocurable resin 19b is selectively applied only to the formation region of the light receiving face side electrode 19 on the antireflection film 17, the photocurable resin 19b has to be applied to a region corresponding to the positions in which the light receiving face side electrodes 19 are formed.

As the conductor material to be contained in the photocurable resin 19b, for example, a metal material such as silver (Ag), gold (Au), copper (Cu), silver-palladium (Ag—Pd) or indium-tin (In—Sn), can be used. Further, as a resin used for the photocurable resin 19b, a photocurable resin such as an epoxy-based resin, an acrylic-based resin, an imide-based resin or a silicone-based resin can be used. Further, the photocurable resin 19b is applied to at least the shape of the light receiving face side electrode 19, that is, a region containing the shape of the front silver grid electrode 23 having form of a long fine line and a thick film, and the shape of the belt-like front silver bus electrode 25 substantially perpendicular to this pattern.

Next, the semiconductor substrate 11 to which the photocurable resin 19b has been applied is placed on a stage 41 with its face to which the photocurable resin 19b has been applied being directed upward (FIG. 6-2). An original intaglio plate 32 is caused to face an electrode forming face (photocurable resin 19b) in the semiconductor substrate, and to be registered in the positions, in which the light receiving face side electrodes 19 are formed, in the electrode forming face (photocurable resin 19b), and the original intaglio plate 32 is pressed against the photocurable resin 19b (FIG. 6-3). At this time, since the entire region of the original intaglio plate 32 in an in-plane direction is pressed uniformly, the entire light receiving face of the semiconductor substrate 11 is pressed uniformly by the original intaglio plate 32. Further, in this circumstance, the photocurable resin 19b is irradiated with ultraviolet rays through the original intaglio plate 32 (FIG. 6-3).

Herein, a reverse pattern obtained by substantially reversing the pattern of the light receiving face side electrode 19, i.e., a reverse pattern obtained by substantially reversing the pattern of the front silver grid electrode 23 and the front silver bus electrode 25, is formed on the original intaglio plate 32 in advance. Further, the original intaglio plate 32 is composed of a material having high transmittance with respect to ultraviolet rays. A pressure for pressing the original intaglio plate 32 against the photocurable resin 19b is measured with a pressure sensor or the like, and kept to a specific pressure. It is preferable that the pressing pressure when a resin containing silver is used as the photocurable resin 19a containing a conductor material be, for example, a pressure of 0.1 Mpa to 1 Mpa. This reason is as follows. When the pressing pressure is smaller than 0.1 Mpa, the pattern may be blurred, and linearity of a linear shape may be impaired. On the other hand, when the pressing pressure is larger than 1 Mpa, the aspect ratio of the pattern may be uneven, and the semiconductor substrate may be destroyed.

Then, after the photocurable resin 19b is irradiated with ultraviolet rays for a specific period of time to be cured, the original intaglio plate 32 is separated from the photocurable resin 19b. Therefore, the pattern of the light receiving face side electrode 19, that is, the pattern of the front silver grid electrode 23 and the front silver bus electrode 25 is transferred to the photocurable resin 19b (FIG. 6-4). That is, the front silver grid electrode 23 and the front silver bus electrode 25 as the light receiving face side electrode 19 are formed on the antireflection film 17 (before baking) (FIG. 2-5).

The original intaglio plate 32 in which the reverse pattern obtained by substantially reversing the pattern of the light receiving face side electrode 19, i.e., the reverse pattern obtained by substantially reversing the pattern of the front silver grid electrode 23 and the front silver bus electrode 25 is formed, is prepared in advance. The reverse pattern formed on the original intaglio plate 32 is then transferred to the photocurable resin 19b. Accordingly, in a direct manufacture step of the light receiving face side electrode 19 in the semiconductor substrate 11, a printing step of a material paste for the light receiving face side electrode as in a conventional method is replaced with a pattern transfer step, and therefore is unnecessary. A drying step of the material paste for the light receiving face side electrode which is required together with the printing step as a set is also unnecessary. Further, since the entire light receiving face of the semiconductor substrate 11 is pressed uniformly by the original intaglio plate 32, occurrence of cracking or chipping of the semiconductor substrate 11 is suppressed, and thereby a yield can be improved.

After that, the semiconductor substrate 11, to which the photocurable resin 19b has been applied, and which is an object to be processed next, is placed on a stage 41, and the above-described treatment is repeated. After that, the steps shown in FIGS. 2-6 and 2-7 in the first embodiment are performed to manufacture the solar battery cell 1.

According to the method for forming a solar battery of the above-described second embodiment, as with the case of the first embodiment, the electrode whose electrode dimension is on from micron order to several tens of micron order, and whose dimension accuracy is on micron order, can be formed. According to the method for forming the solar battery of the second embodiment, for example, a front silver grid electrode 23 having a line width of 10 μm to 90 μm, an electrode thickness of 10 μm to 90 μm, and an aspect ratio (electrode thickness/electrode width) of 0.35 to 1 can be formed. That is, a front silver grid electrode 23 having form of very narrower line width and thicker film can be formed as compared with electrode dimensions of a line width of about 100 μm to 200 μm, and a thickness of about 10 μm to 20 μm, which is formed by a conventional method using the screen printing. Note that an electrode thickness and an aspect ratio (electrode thickness/electrode width) have their respective appropriate values depending on the line width of an electrode to be designed.

Further, in the case of using a resin containing silver as the photocurable resin 19b containing a conductor material, the electrode line width of the front silver grid electrode 23 is preferably set to 40 μm to 80 μm. Herein, the reason why the electrode line width of the front silver grid electrode 23 is preferably 40 μm to 80 μm is as follows. By the method for forming the solar battery according to the present embodiment, as described above, an electrode having a line width of 10 μm to 90 μm, an electrode thickness of μm 10 to 90 μm, and an aspect ratio (electrode thickness/electrode width) of 0.35 to 1 can be formed.

However, in the case of using a resin containing silver as the photocurable resin 19b containing a conductor material, when the cross-sectional area of the electrode is smaller than a certain value, the resistance value of the electrode is increased enough to affect the characteristics of the solar battery. Therefore, in the method for forming the solar battery according to the second embodiment, an electrode having a shape satisfying the above-described conditions can be formed. In the case of using a resin containing silver as the photocurable resin 19b containing a conductor material, however, the electrode width of the front silver grid electrode 23 is preferably 40 μm to 80 μm.

Further, in the method for forming the solar battery according to the second embodiment, it is possible to realize the aspect ratio (electrode thickness/electrode width) exceeding 1, although it is in an excessive specification as an electrode structure. In particular, when the electrode line width is a line width as very narrow as 50 μm or smaller, occurrence probabilities of destruction of formed electrodes and decrease in adhesion strength between the electrode and a lower layer are increased. This electrode cannot function properly.

On the other hand, in the method for forming the solar battery according to the second embodiment, it is possible to realize the aspect ratio (electrode thickness/electrode width) smaller than 0.35. Although the required aspect ratio varies depending on the line width to be designed, the cross-sectional area of the electrodes is decreased, and the electric resistance of the electrodes themselves is increased when the aspect ratio (electrode thickness/electrode width) is smaller than 0.35. The power generation efficiency cannot be increased by a large current obtained in the substrate, and the output characteristics of the solar battery cannot be improved. In particular, when the aspect ratio (electrode thickness/electrode width) of an electrode is 0.3 or smaller, the breaking probability is increased due to decrease in electrode thickness, or the electrode resistance is increased due to decrease in electrode cross-sectional area. This electrode cannot function properly.

Therefore, from the viewpoint of function, the aspect ratio (electrode thickness/electrode width) of the electrode is preferably in a range of 0.35 to 1. When the aspect ratio (electrode thickness/electrode width) of the electrode falls within this range, disconnection of the electrode does not occur, the resistance value of the electrode itself stabilizes to an intrinsic value of the material, and occurrence probabilities of destruction of formed electrodes and decrease in adhesion strength between the electrode and a lower layer are not increased.

Further, also in the method for forming the solar battery according to the second embodiment, as shown in FIG. 5, an angle of inclination θ is 60° to 90°. By setting the angle of inclination to 60° to 90°, the cross-sectional shape of the electrode becomes like a shape which does not so spread toward the bottom and whose side wall is upright. In addition, this can prevent the photoelectric conversion efficiency from decreasing by increasing the area which shields the light receiving face due to the cross-sectional shape of the electrode, and accordingly, the photoelectric conversion efficiency is increased. Note that also in the method for forming the solar battery according to the second embodiment, the upper limit of the angle of inclination is 90°.

As discussed above, in the method for manufacturing the solar battery cell according to the second embodiment, the original intaglio plate 32 is pressed against the photocurable resin 19*b* applied to the antireflection film 17 of the semiconductor substrate 11, and a pattern of the light receiving face side electrode 19 is thereby transferred to the photocurable resin 19*b*, so that the pattern of the light receiving face side electrode 19 is formed. That is, the pattern of the light receiving face side electrode 19 is formed directly on the antireflection film 17 of the semiconductor substrate 11.

When such a technique is employed, as with the first embodiment, in a direct manufacture step of the light receiving face side electrode 19 on the semiconductor substrate 11, a printing step of a material paste for the light receiving face side electrode in the conventional art is replaced with a pattern transfer step, and therefore is unnecessary. A drying step of the material paste for the light receiving face side electrode which is required together with the printing step as a set is also unnecessary. Further, since the entire light receiving face of the semiconductor substrate 11 is pressed uniformly by the original intaglio plate 32, there is not a moving step while pressurizing as in the screen printing. Accordingly, occurrence of cracking or chipping of the semiconductor substrate 11 is suppressed, and a yield can be improved. Further, when such a technique is employed, an electrode pattern which is not blurred and is perpendicular can be formed even on a substrate whose surface is not smooth.

Further, in the method for manufacturing the solar battery cell according to the second embodiment, as with the case of the first embodiment, an electrode having a range of an aspect ratio of 0.35 to 1 and an angle of inclination of 60° to 90° can be formed. Therefore, an electrode having form of a narrower line width and a greater thickness than those of the conventional one can be manufactured at low cost with high precision. That is, the pattern of the formed light receiving face side electrode 19 does not become a shape in which the cross-section of the electrode takes the form of a barrel-vaulted shape spreading toward the bottom, as in the case of using the screen printing. Therefore, this can prevent the photoelectric conversion efficiency from decreasing by increasing the area which shields the light receiving face due to the cross-sectional shape of the electrode, and accordingly, the photoelectric conversion efficiency is increased.

Further, since an electrode having a range of the angle of inclination of 60° to 90° can be formed, an electrode having the same cross-sectional area as in the conventional one can be formed while having a line width narrower than that of the conventional one. That is, the bottom area (the area on the light receiving face) required to form an electrode having the same cross-sectional area can be reduced, and the area of a light receiving region contributing to electric power generation can be increased in the light receiving face by the reduced area. Therefore, in the method for manufacturing the solar battery cell according to the second embodiment, as with the case of the first embodiment, the wider area of the light receiving region contributing to electric power generation can be ensured in the light receiving face, and the photoelectric conversion efficiency per sheet of the solar battery cell is increased. A solar battery cell superior in photoelectric conversion efficiency can thereby be manufactured.

Further, although the original intaglio plate 32 used in the method for manufacturing the solar battery cell according to the second embodiment cannot be used permanently, since the durable number of the plate significantly exceeds that of a screen plate used in the screen printing, the cost can be reduced. Further, since the dimension accuracy of the manufactured electrode pattern has little difference between the time when starting use of the original intaglio plate 32 and the time after completion of using it, the dimension accuracy of the electrode pattern does not vary depending on the number of times the original intaglio plate 32 is used, and an electrode having a high accuracy can thereby be manufactured.

Therefore, according to the method for manufacturing the solar battery cell according to the second embodiment, a desired shape of a pattern can be directly obtained by performing a single process of pattern transfer to an electrode material just once without the indirect pattern formation as in a conventional method. For this reason, a complex process as in the conventional method is unnecessary, and an electrode having form of a narrow line width and a thick film can be formed in a good yield inexpensively by a simple process.

Further, according to the method for manufacturing the solar battery cell according to the second embodiment, the original intaglio plate 32 can be pressed with a smaller force than that in the case of the first embodiment, and a pattern can be formed without heating. Therefore, since effect of stress on the electrode after the formation of the electrode is small, an electrode having better quality can be formed. Further, in the method for manufacturing the solar battery cell according to the second embodiment, since a transparent mold is used as the original intaglio plate 32, it is advantage that registering on the semiconductor substrate 11 is easy.

In any of techniques described in the above embodiments, a method for individually processing a single semiconductor substrate 11 has been described. However, a stage capable of placing and delivering a plurality of semiconductor substrates 11 and a plurality of original intaglio plates 32 corresponding to the delivered semiconductor substrates 11 are prepared, so that a series of pattern transfer steps mentioned above can be continuously performed. For example, belt-like stages 31, 33 and 41, and a plurality of belt-like original intaglio plates 32 are provided, so that the series of pattern transfer steps can be continuously performed. As such stages, for example, a round trip shuttle-like stage can be used. Further, a stage for delivering the plurality of semiconductor substrates 11 may be combined with a single original intaglio plate 32.

INDUSTRIAL APPLICABILITY

As described above, a method for forming electrodes of a solar battery according to the present invention is useful when electrodes of a solar battery having a fine pattern are formed simply and inexpensively.

REFERENCE SIGNS LIST

1 Solar Battery Cell
11 Semiconductor Substrate
11a P-Type Polycrystalline Silicon Substrate
13 P-Type Polycrystalline Silicon Layer
15 N-Type Impurity Diffusing Layer
17 Antireflection Film
19 Light Receiving Face Side Electrode
19a Thermoplastic Resin
19b Photocurable Resin
21 Back Side Electrode
21a Back Side Electrode Material Paste
23 Front Silver Grid Electrode
25 Front Silver Bus Electrode
31 Heating Stage
32 Original Intaglio Plate
33 Cooling Stage
θ Angle of Inclination

The invention claimed is:

1. A method for forming an electrode of a solar battery on an electrode forming face of a semiconductor substrate, the method comprising:
a first step of applying a resin containing a conductor material to be the electrode onto an electrode forming region of the electrode forming face;
a second step of causing a pattern transfer member, on which a reverse pattern obtained by substantially reversing a pattern of the electrode is formed, to face the electrode forming face, and registering the pattern transfer member on a position in which the electrode is to be formed in the electrode forming face;
a third step of pressing the pattern transfer member against the electrode forming face to transfer the electrode pattern to the resin containing the conductor material;
a fourth step of separating the pattern transfer member from the resin containing the conductor material; and
a fifth step of baking the electrode pattern transferred to the resin containing the conductor material to form the electrode on the electrode forming face of the semiconductor substrate.

2. The method for forming an electrode of a solar battery according to claim 1, wherein the resin containing the conductor material is applied only to the electrode forming region of the electrode forming face.

3. The method for forming an electrode of a solar battery according to claim 1, wherein
a thermoplastic resin is used as the resin containing the conductor material in the first step, and
the resin containing the conductor material is heated to be softened and the pattern transfer member is pressed against the electrode forming face in the third step.

4. The method for forming an electrode of a solar battery according to claim 1, wherein
a photocurable resin is used as the resin containing the conductor in the first step,
the pattern transfer member made of a light-transmitting material is used in the second step, and
the resin containing the conductor material is irradiated with light through the pattern transfer member with the pattern transfer member pressed against the electrode forming face in the third step.

5. The method for forming an electrode of a solar battery according to claim 1, wherein an entire region of the electrode forming face is uniformly pressed in the third step.

6. The method for forming an electrode of a solar battery according to claim 1, wherein the pattern transfer member is pressed at a pressure of 0.1 Mpa to 1 Mpa in the third step.

7. The method for forming an electrode of a solar battery according to claim 1, wherein
a plurality of semiconductor substrates are subjected to the first step to form a plurality of semiconductor substrates in which the resin containing the conductor material to be the electrode has been applied onto the electrode forming region of the electrode forming face; and
the plurality of semiconductor substrates which have been subjected to the first step are continuously treated by the second to fourth steps.

8. The method for forming an electrode of a solar battery according to claim 1, wherein the electrode has an electrode width of 10 μm to 90 μm, an electrode thickness of 10 μm to 90 μm, an aspect ratio (electrode thickness / electrode width) of 0.35 to 1, and an angle of inclination of a side wall along a longitudinal direction of the electrode with respect to the semiconductor substrate of 60° to 90°.

9. A solar battery manufactured using the method for forming an electrode of a solar battery according to claim 1,
the semiconductor substrate having a PN junction,
the solar battery comprising:
an antireflection film formed on a light receiving face of the semiconductor substrate;
a light receiving face side electrode formed on a side of the light receiving face of the semiconductor substrate, as the electrode; and
a back side electrode formed on a face opposite to the light receiving face of the semiconductor substrate, wherein
the light receiving face side electrode has a fine line electrode having an electrode width of 10 μm to 90 μm, an electrode thickness of 10 μm to 90 μm, an aspect ratio (electrode thickness / electrode width) of 0.35 to 1, and an angle of inclination of a side wall along a longitudinal direction of the light receiving face side electrode with respect to the semiconductor substrate of 60° to 90°.

10. A method for manufacturing a solar battery, comprising:
a first step of forming an impurity diffusing layer in which a second conductive type impurity element is diffused on one face of a first conductive type semiconductor substrate;
a second step of forming an antireflection film on the impurity diffusing layer;
a third step of applying a resin containing a conductor material to be a light receiving face side electrode onto the antireflection film;
a fourth step of causing a pattern transfer member, on which a reverse pattern obtained by substantially reversing a pattern of the light receiving face side electrode is formed, to face one face of the semiconductor substrate, and registering the pattern transfer member on a position in which the light receiving face side electrode is to be formed on a side of the one face of the semiconductor substrate;
a fifth step of pressing the pattern transfer member against the one face of the semiconductor substrate to transfer the pattern of the light receiving face side electrode to the resin containing the conductor material;

a sixth step of separating the pattern transfer member from the resin containing the conductor material;

a seventh step of placing an electrode material in a pattern of a back side electrode on the other face of the semiconductor substrate; and an eighth step of baking the pattern of the light receiving face side electrode and the pattern of the back side electrode to form the light receiving face side electrode which is electrically connected to the impurity diffusing layer with penetrating through the antireflection film, and the back side electrode.

* * * * *

UNITED STATES PATENT AND TRADEMARK OFFICE
CERTIFICATE OF CORRECTION

| | |
|---|---|
| PATENT NO. | : 9,029,186 B2 |
| APPLICATION NO. | : 13/386986 |
| DATED | : May 12, 2015 |
| INVENTOR(S) | : Makoto Doi |

Page 1 of 1

It is certified that error appears in the above-identified patent and that said Letters Patent is hereby corrected as shown below:

On the Title Page, Item (73) Assignee: Change "Mitsubishi Electric Coporation" to --Mitsubishi Electric Corporation--.

Signed and Sealed this
Twenty-fourth Day of November, 2015

Michelle K. Lee
*Director of the United States Patent and Trademark Office*